(12) United States Patent
Cheng (10) Patent No.: US 11,687,105 B2
(45) Date of Patent: Jun. 27, 2023

(54) DRIVING DEVICE

(71) Applicant: NOVATEK MICROELECTRONICS CORP., Hsinchu (TW)

(72) Inventor: Kuo Wei Cheng, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 160 days.

(21) Appl. No.: 17/363,472

(22) Filed: Jun. 30, 2021

(65) Prior Publication Data

US 2023/0004179 A1 Jan. 5, 2023

(51) Int. Cl.
| | |
|---|---|
| *H03K 17/687* | (2006.01) |
| *G05F 1/56* | (2006.01) |
| *H03K 19/0944* | (2006.01) |
| *G05F 1/44* | (2006.01) |
| *H03K 17/06* | (2006.01) |

(52) U.S. Cl.
CPC ............ *G05F 1/56* (2013.01); *G05F 1/44* (2013.01); *H03K 17/063* (2013.01); *H03K 17/6871* (2013.01); *H03K 19/0944* (2013.01)

(58) Field of Classification Search
CPC ........ G11B 5/02; G11B 5/022; H03K 17/161; H03K 17/302; H03K 17/56; H03K 17/567; H03K 17/60; H03K 17/687; H03K 17/6871; H03K 17/16; H03K 17/30; H03K 17/601; H03K 17/64; H03K 17/691; H03K 17/731; H03K 17/10; H03K 17/102; H03K 17/107; H03K 17/12; H03K 17/122; H03K 17/127; H03K 19/00346; H03K 19/00353; H03K 19/00361; H03K 19/003; H03K 19/00307; H03K 19/00315; H04L 25/026
See application file for complete search history.

(56) References Cited

U.S. PATENT DOCUMENTS

| | | | |
|---|---|---|---|
| 7,773,079 B2 | 8/2010 | Tsao et al. | |
| 2019/0379375 A1* | 12/2019 | Havanur | H03K 17/6877 |

FOREIGN PATENT DOCUMENTS

DE 112014002021 T5 * 1/2016 ............... H02H 3/08

* cited by examiner

*Primary Examiner* — Bryan R Perez
(74) *Attorney, Agent, or Firm* — Rosenberg, Klein & Lee (57) ABSTRACT

A driving device includes a voltage regulator, a voltage generator, and a first NMOSFET. The voltage regulator is coupled between a first high-voltage terminal and the output terminal of the driving device. The voltage regulator receives the first high voltage of the first high-voltage terminal. The voltage regulator steps down the first high voltage to generate a supply voltage. The voltage generator is coupled to a second high-voltage terminal and the output terminal of the driving device. The voltage generator provides a reference voltage for the output terminal of the driving device. The reference voltage is substantially lower than the supply voltage. The first NMOSFET is coupled between the output terminal of the driving device and a low-voltage terminal.

7 Claims, 12 Drawing Sheets

Fig. 4 the voltage regulator receives the first high voltage of the first high-voltage terminal and steps down the first high voltage to generate a supply voltage. The voltage generator receives a first control signal. The gate of the first NMOSFET receives a second control signal corresponding to the first control signal. The gate of the first PMOSFET receives a third control signal corresponding to the second control signal ~S10 the first control signal and the second high voltage of the second high-voltage terminal drive the voltage generator to provide a reference voltage for the output terminal of the driving device and charge the load to the reference voltage through the output terminal for a period T1 when the voltage of the first control signal changes from logic "0" to logic "1". The second control signal turns off the first NMOSFET and the third control signal turns off the first PMOSFET when the first control signal and the second high voltage of the second high-voltage terminal drive the voltage generator to provide the reference voltage for the output terminal and charge the load to the reference voltage through the output terminal ~S11 the second control signal turns off the first NMOSFET, the third control signal turns on the first PMOSFET, the supply voltage is provided to the output terminal of the driving device through the first PMOSFET, and the load is charged to the supply voltage through the first PMOSFET and the output terminal after the load is charged to the reference voltage ~S12

Fig. 5(a)

| the first control signal drives the voltage generator to stop providing the reference voltage for the output terminal of the driving device and charging the load when the voltage of the first control signal changes from logic "1" to logic "0". The second control signal turns off the first NMOSFET and the third control signal turns off the first PMOSFET to stop providing the supply voltage for the output terminal and charging the load to the supply voltage when the first control signal drives the voltage generator to stop providing the reference voltage and charging the load | ∼S13 |

| the second control signal turns on the first NMOSFET to discharge the load to the low voltage through the output terminal and the third control signal turns off the first PMOSFET to stop providing the supply voltage and charging the load to the supply voltage when the first control signal drives the voltage generator to stop providing the reference voltage and charging the load | ∼S14 |

DRIVING DEVICE

BACKGROUND OF THE INVENTION

Field of the Invention

The invention relates to the driving technology, particularly to a driving device free of an external capacitor.

Description of the Related Art

Integrated circuits (ICs) include transistors such as complementary metal-oxide semiconductor (CMOS) transistors that are used to implement logic circuitry. ICs often operate in different power modes including RUN, STANDBY and STOP modes for effective power management. In order to reduce wiring complexity, the IC receives the voltage of a single power supply to drive a load when the IC enters a RUN mode.

Figure 1:
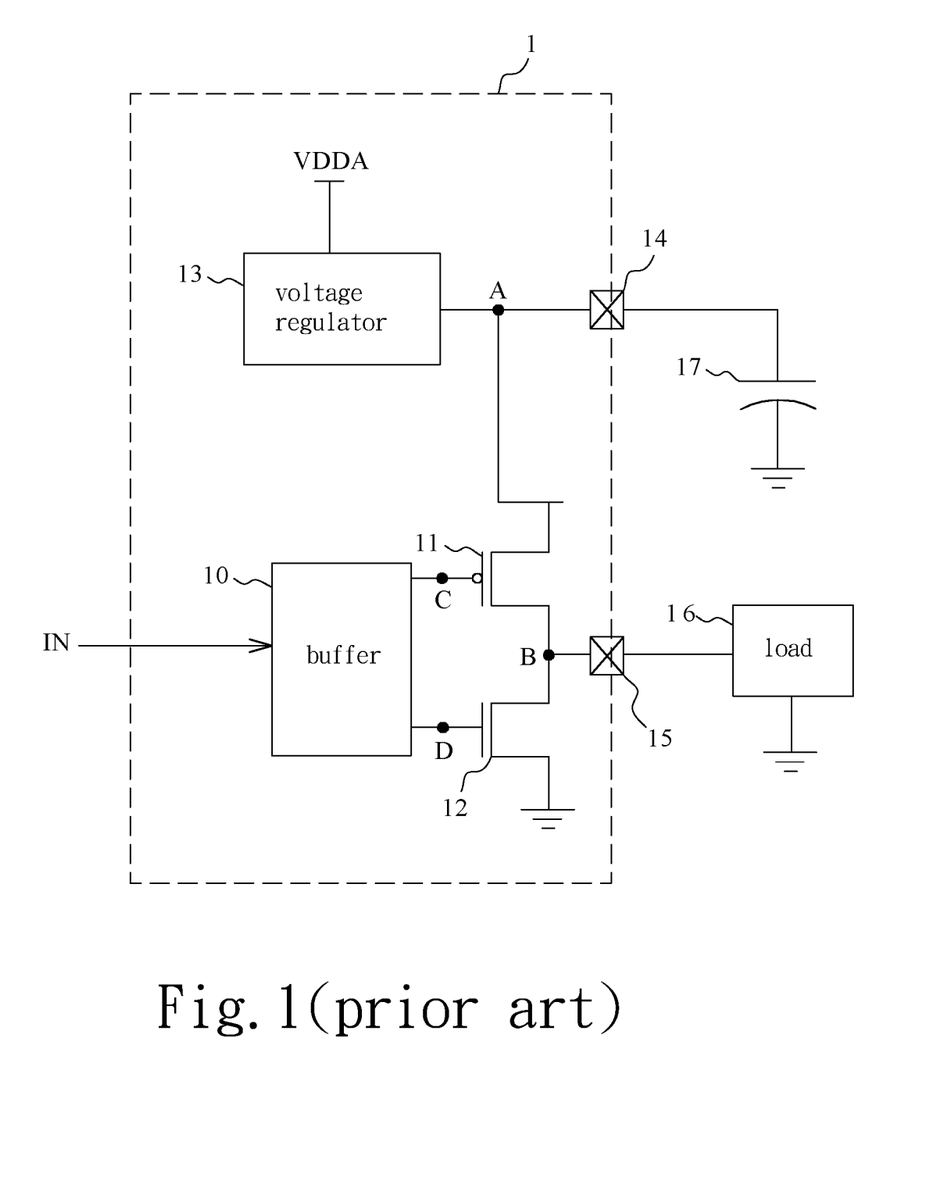
FIG. 1 is a diagram schematically illustrating a conventional integrated circuit (IC) for driving a load.
Figure 2:
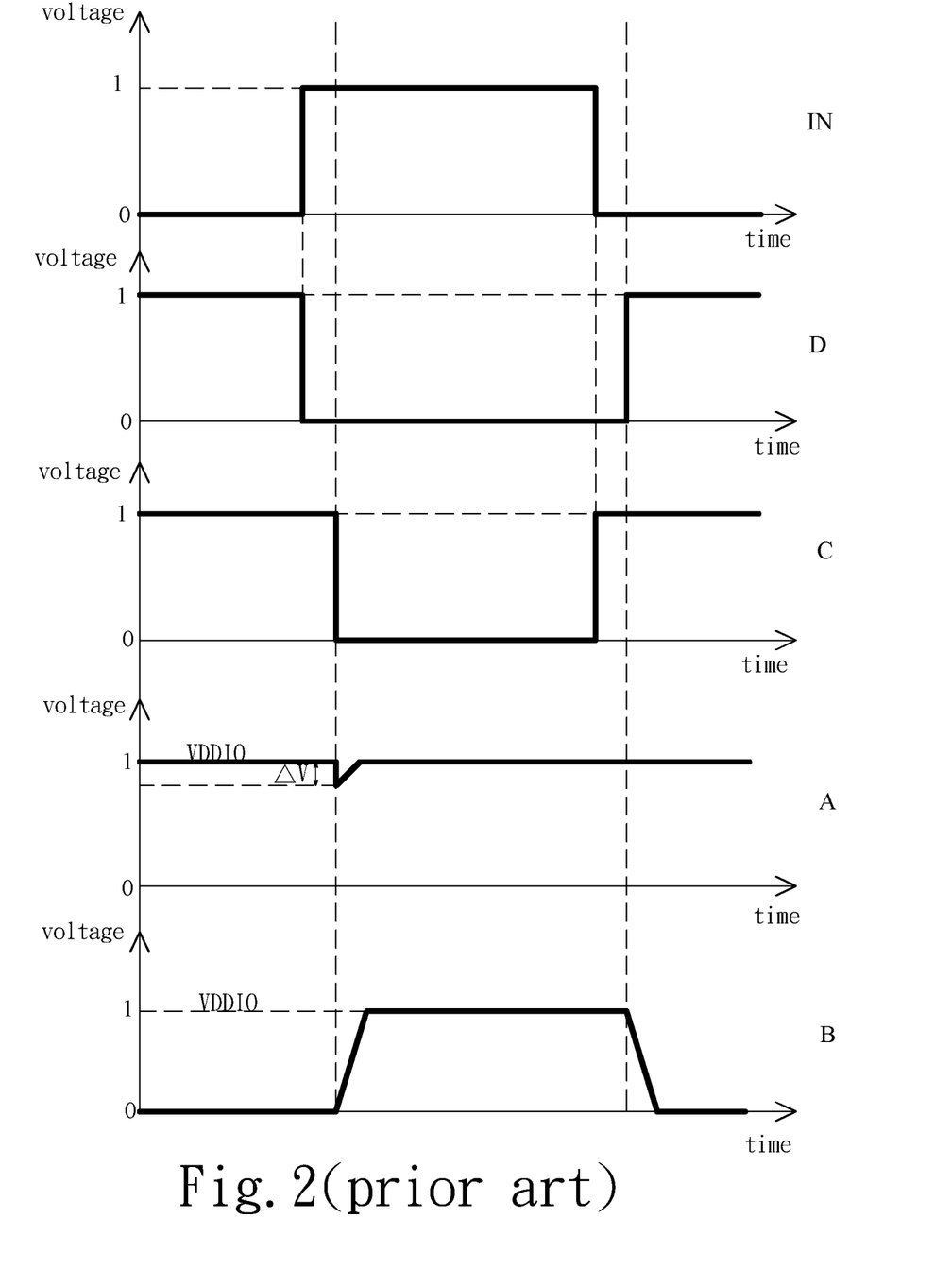
FIG. 2 is a diagram schematically illustrating the waveforms of nodes and an input signal of a conventional IC for driving a load.

FIG. 1 is a diagram schematically illustrating a conventional integrated circuit (IC) for driving a load. FIG. 2 is a diagram schematically illustrating the waveforms of nodes and an input signal of a conventional IC for driving a load. Referring to FIG. 1 and FIG. 2, an IC 1 includes a buffer 10, a P-channel metal-oxide-semiconductor field effect transistor (PMOSFET) 11, an N-channel metal-oxide-semiconductor field effect transistor (NMOSFET) 12, a voltage regulator 13, and conductive terminals 14 and 15. The conductive terminal 15 is coupled to a load 16. The load 16 has parasitic capacitances. The voltage regulator 13 is coupled to a single power terminal whose voltage is represented by VDDA. The voltage regulator 13 receives the voltage VDDA and converts the voltage VDDA into a supply voltage VDDIO. In other words, the conductive terminal 14 has the voltage VDDIO. The voltages of the conductive terminals 14 and 15 and the gates of the PMOSFET 11 and the NMOSFET 12 are respectively the voltages of nodes A, B, C, and D. The buffer 10 receives an input signal IN to drive the PMOSFET 11 and the NMOSFET 12, thereby charging or discharging the load 16. When the voltage of the conductive terminal 15 changes from logic "0" to logic "1", the PMOSFET 11 immediately receives the voltage VDDIO to generate a large driving current for driving the load 16. Simultaneously, the large driving current causes voltage undershoot at the conductive terminal 14 such that the load 16 reads incorrect data. The value of the driving current depends on the resistance of the PMOSFET 11. The conductive terminal 14 has a voltage difference ΔV. The voltage difference ΔV is expressed by equation (1).

$$\Delta V = \frac{\int_0^T I(t)dt}{C} \quad (1)$$

Wherein t represents time and C represents the capacitance of an external capacitor 17. T represents integration time that depends on the capacitances of the load 16. I(t) represents the driving current, which is a function of t. Due to the large driving current, the time of recovering the voltage regulator 13 is too long to restore the voltage of the conductive terminal 14 to VDDIO in time. In order to stabilize the voltage of the conductive terminal 14, the IC 1 requires a capacitor to maintain the voltage of the conductive terminal 14. Taking the area of the IC 1 into consideration, any capacitor having a capacitance of μF order is not integrated into the IC 1. As a result, the external capacitor 17 is used to reduce the voltage difference ΔV and avoid affecting the output voltage level of the IC 1. However, the external capacitor 17 will increase the material cost of the IC 1 and the space occupied by the module.

SUMMARY OF THE INVENTION

The invention provides a driving device, which avoids coupling to any external capacitor to reduce the material cost of an integrated circuit (IC) and the space occupied by the entire module.

In an embodiment of the invention, a driving device includes a voltage regulator, a voltage generator, and a first N-channel metal-oxide-semiconductor field effect transistor (NMOSFET). The voltage regulator is coupled between a first high-voltage terminal and the output terminal of the driving device. The voltage regulator is configured to receive the first high voltage of the first high-voltage terminal. The voltage regulator is configured to step down the first high voltage to generate a supply voltage. The voltage generator is coupled to a second high-voltage terminal and the output terminal of the driving device. The voltage generator is configured to provide a reference voltage for the output terminal of the driving device. The reference voltage is substantially lower than the supply voltage. The first NMOSFET is coupled between the output terminal of the driving device and a low-voltage terminal.

To sum up, the driving device provides the reference voltage for the output terminal of the driving device to weaken voltage undershoot before the voltage regulator provides the supply voltage for the output terminal of the driving device. Thus, the driving device can avoid coupling to any external capacitor to reduce the material cost of an integrated circuit (IC) and the space occupied by the entire module.

Below, the embodiments are described in detail in cooperation with the drawings to make easily understood the technical contents, characteristics and accomplishments of the invention.

DETAILED DESCRIPTION OF THE INVENTION

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range. For example, if it is described that the length of a component is X cm to Y cm, then it is equivalent to sentence "the length of the component is H, and H can be any real number values between the values of X and Y".

In the following description, a driving device will be provided. The driving device provides a reference voltage for the output terminal of the driving device to weaken voltage undershoot before a voltage regulator provides a supply voltage for the output terminal of the driving device. Thus, the driving device can avoid coupling to any external capacitor to reduce the material cost of an integrated circuit (IC) and the space occupied by the module.

Figure 3:
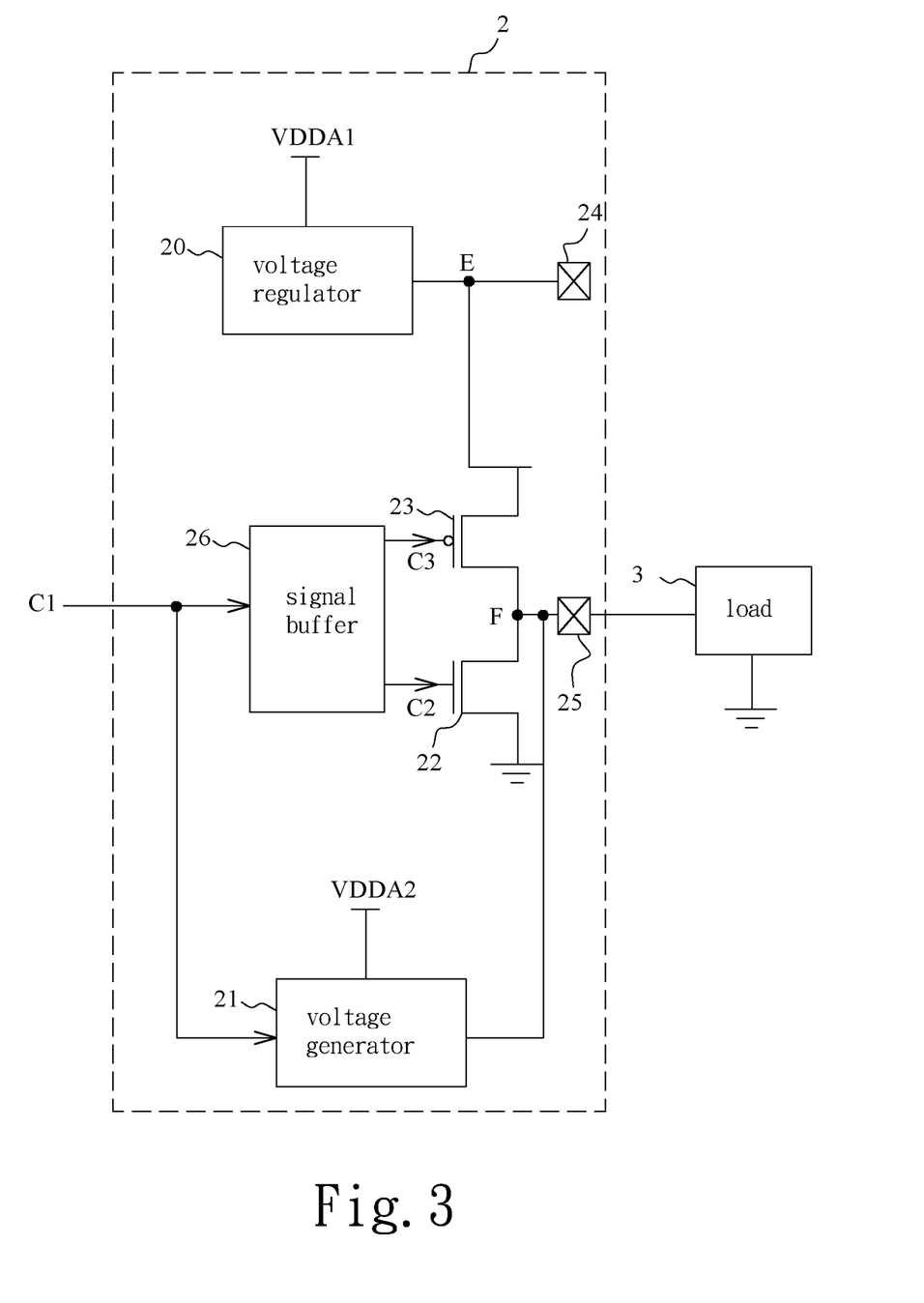
FIG. 3 is a diagram schematically illustrating a driving device according to a first embodiment of the invention.
Figure 4:
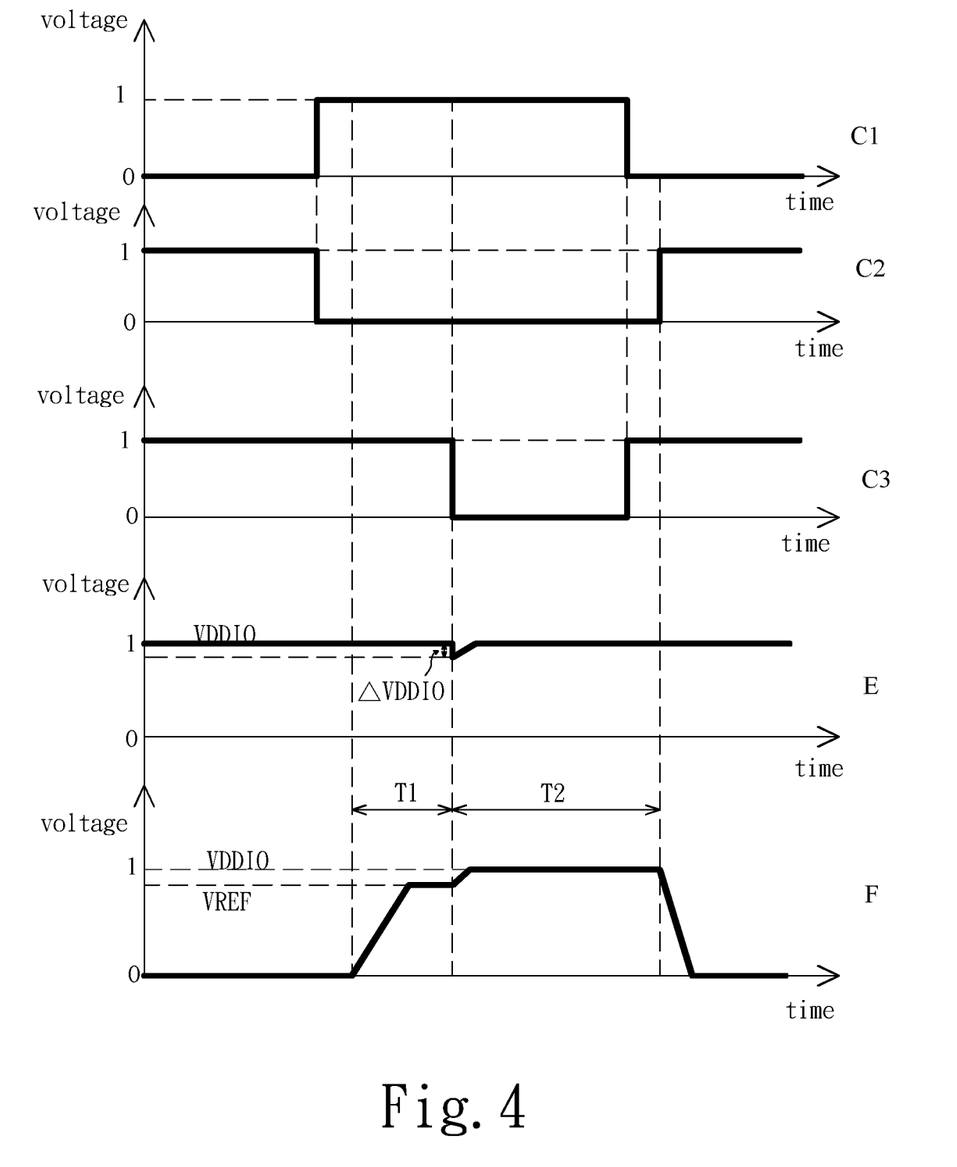
FIG. 4 is a diagram schematically illustrating the waveforms of nodes, a first control signal, a second control signal, and a third control signal of the driving device according to the first embodiment of the invention.
Figure 5A:
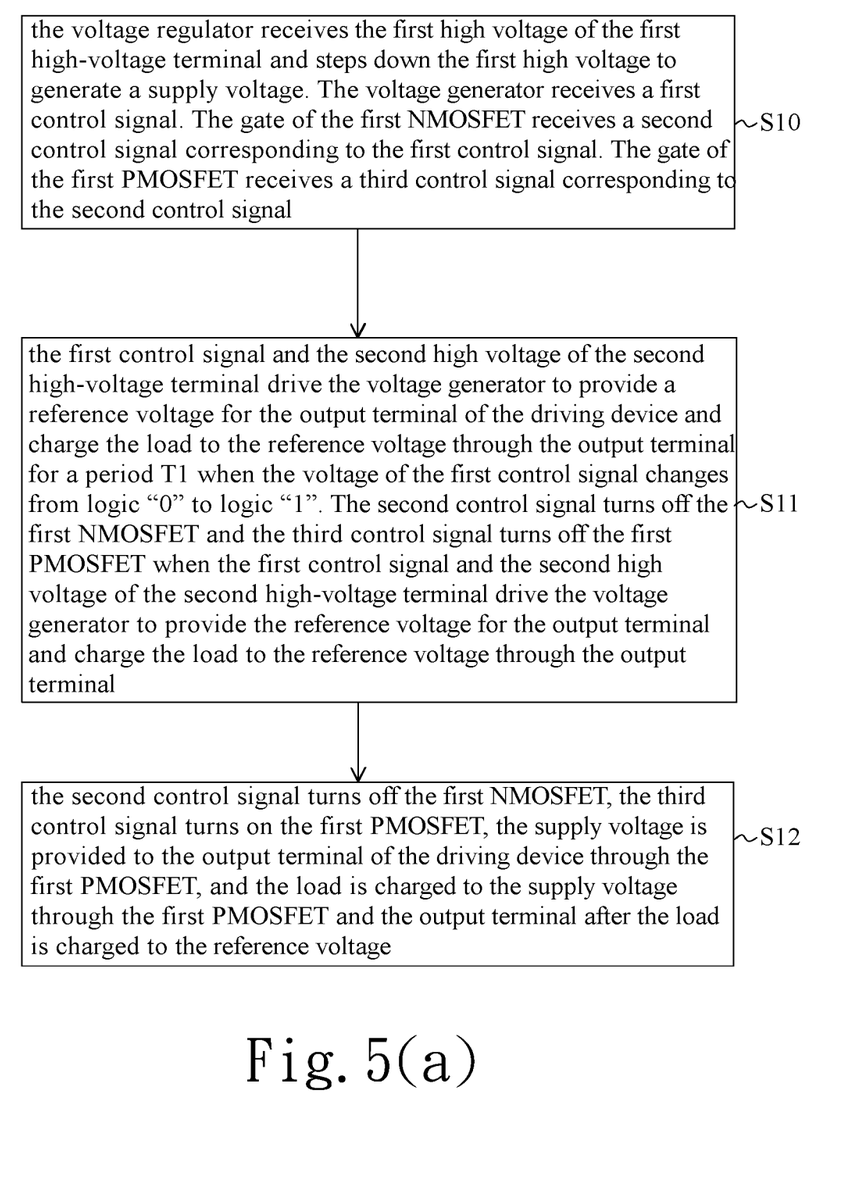
FIG. 5(a) is a flowchart of the driving device for charging a load according to the first embodiment of the invention.

FIG. 3 is a diagram schematically illustrating a driving device according to a first embodiment of the invention. FIG. 4 is a diagram schematically illustrating the waveforms of nodes, a first control signal, a second control signal, and a third control signal of the driving device according to the first embodiment of the invention. FIG. 5(a) is a flowchart of the driving device for charging a load according to the first embodiment of the invention. The architecture in FIG. 1 is used in the following embodiments. Referring to FIG. 3, FIG. 4, and FIG. 5(a), the first embodiment of the invention is introduced as follows. In the first embodiment, a driving device 2 is coupled to a load 3 having parasitic capacitances. The driving device 2 can be integrated in an IC. The driving device 2 includes a voltage regulator 20, a voltage generator 21, a first N-channel metal-oxide-semiconductor field effect transistor (NMOSFET) 22, a first P-channel metal-oxide-semiconductor field effect transistor (PMOSFET) 23, a conductive terminal 24, and an output terminal 25. The voltage regulator 20 may be implemented with a low-dropout regulator (LDO), but the invention is not limited thereto. The output terminal 25 may be, but not limited to, a digital output terminal or a serial peripheral interface (SPI). The voltage regulator 20 is coupled to a first high-voltage terminal whose first high voltage is represented by VDDA1 and the conductive terminal 24. The voltage generator 21 is coupled to a second high-voltage terminal whose second high voltage is represented by VDDA2 and the output terminal 25. The first high voltage VDDA1 is substantially equal to or different from the second high voltage VDDA2. The second high-voltage terminal may be replaced with the first high-voltage terminal. The first high-voltage terminal and the second high-voltage terminal may be external voltage sources or implemented with external capacitors. The output terminal 25 of the driving device 2 is coupled to the load 3. The voltages of nodes E and F respectively represent the voltages of the conductive terminal 24 and the output terminal 25. The first NMOSFET 22 is coupled between the output terminal 25 and a low-voltage terminal. The low-voltage terminal may be a grounding terminal, but the invention is not limited thereto. The source and the drain of the first NMOSFET 22 may be respectively coupled to the low-voltage terminal and the output terminal 25 of the driving device 2. Alternatively, the drain and the source of the first NMOSFET 22 may be respectively coupled to the low-voltage terminal and the output terminal 25. The first PMOSFET 23 is coupled between the voltage regulator 20 and the output terminal 25. The first PMOSFET 23 and the voltage regulator 20 are commonly coupled to the conductive terminal 24. The source and the drain of the first PMOSFET 23 may be respectively coupled to the voltage regulator 20 and the output terminal 25. Alternatively, the drain and the source of the first PMOSFET 23 may be respectively coupled to the voltage regulator 20 and the output terminal 25.

The charging process of the driving device 2 is introduced as follows. In Step S10, the voltage regulator 20 receives the first high voltage VDDA1 of the first high-voltage terminal and steps down the first high voltage VDDA1 to generate a supply voltage VDDIO. The supply voltage VDDIO is lower than the first high voltage VDDA1. For example, the supply voltage VDDIO has a range of 1.4-1.8 V and the first high voltage VDDA1 may be 3.3 V. The voltage generator 21 receives a first control signal C1. The gate of the first NMOSFET 22 receives a second control signal C2 corresponding to the first control signal C1. The gate of the first PMOSFET 23 receives a third control signal C3 corresponding to the second control signal C2. The first control signal C1, the second control signal C2, and the third control signal C3 may be digital signals, but the invention is not limited thereto. In Step 10, the voltages of the first control signal C1, the second control signal C2, the third control signal C3, and the node F are respectively logic "0", logic "1", logic "1", and logic "0". The first control signal C1 drives the voltage generator 21 to stop charging the load 3. The second control signal C2 turns on the first NMOSFET 22. The third control signal C3 turns off the first PMOSFET 23.

In Step S11, the first control signal C1 and the second high voltage VDDA2 of the second high-voltage terminal drive the voltage generator 21 to provide a reference voltage VREF for the output terminal 25 of the driving device 2 and charge the load 3 to the reference voltage VREF through the output terminal 25 for a period T1 when the voltage of the first control signal C1 changes from logic "0" to logic "1". The second control signal C2 turns off the first NMOSFET 22 and the third control signal C3 turns off the first PMOSFET 23 when the first control signal C1 and the second high voltage VDDA2 of the second high-voltage terminal drive the voltage generator 21 to provide the reference voltage VREF for the output terminal 25 and charge the load 3 to the reference voltage VREF through the output terminal 25. During the period T1, the supply voltage VDDIO is not affected due to turning off the first PMOSFET 23. The reference voltage VREF is substantially higher than the low voltage of the low-voltage terminal and lower than the supply voltage VDDIO. In practice, the reference voltage VREF is near the supply voltage VDDIO. In Step S11, the voltages of the second control signal C2 and the third control signal C3 are respectively logic "0" and logic "1".

In Step S12, the second control signal C2 turns off the first NMOSFET 22, the third control signal C3 turns on the first PMOSFET 23, the supply voltage VDDIO is provided to the output terminal 25 of the driving device 2 through the first PMOSFET 23, and the load 3 is charged to the supply voltage VDDIO through the first PMOSFET 23 and the output terminal 25 after the reference voltage VREF is provided to the output terminal 25 of the driving device 2. In Step S12, the voltages of the first control signal C1, the second control signal C2, the third control signal C3, and the node F are respectively logic "1", logic "0", logic "0", and logic "1". In Step S12, the driving current passing through the first PMOSFET 23 is very small since the reference voltage VREF is near the supply voltage VDDIO. Although the voltage of the node E is immediately decreased by a voltage difference ΔV due to the very small driving current, the voltage difference ΔV is smaller and the voltage of the node E is very slightly varied. Thus, the voltage of the node E can correspond to the voltage specification of the load 3. The voltage of the node F is logic "1" for a period T2. The driving device 2 provides the reference voltage VREF for the output terminal 25 of the driving device 2 to weaken voltage undershoot of the conductive terminal 24 before the voltage regulator 21 provides the supply voltage VDDIO for the output terminal 25 of the driving device 2. Accordingly, the driving device 2 is free of coupling to any external capacitor, thereby reducing the material cost of the IC and the space occupied by the entire module. If the voltage regulator 20 is omitted, the voltage of the conductive terminal 24 will be maintained at the first high voltage VDDA1. That is to say, the voltage undershoot of the conductive terminal 24 does not occur. As a result, the voltage regulator 20 is indispensable.

Figure 5B:
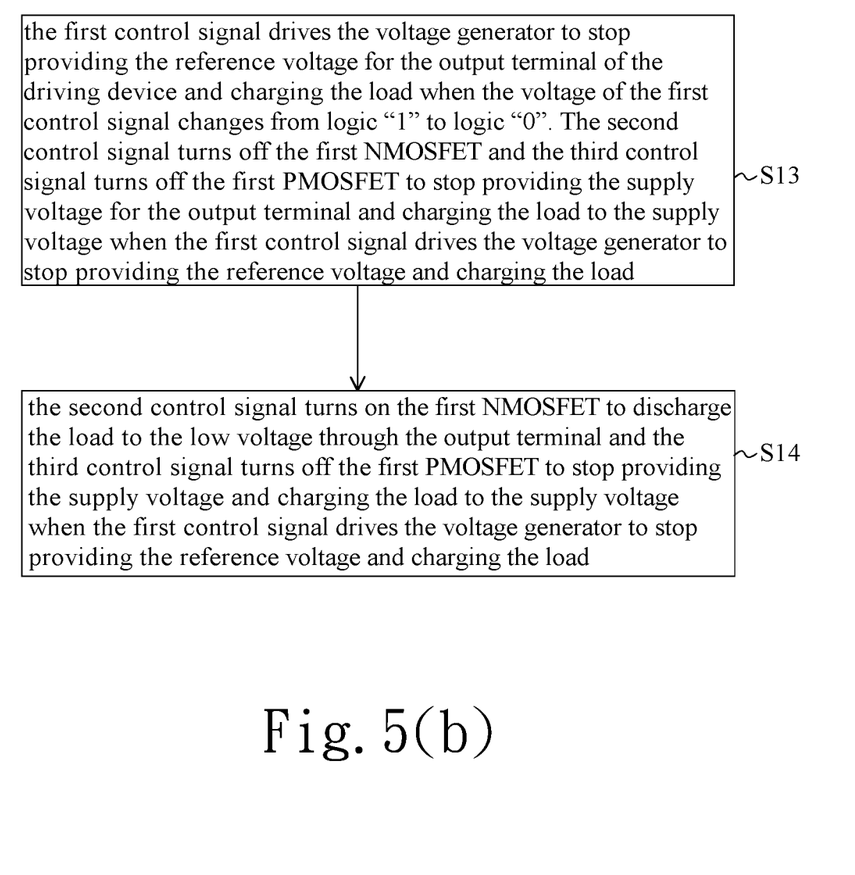
FIG. 5(b) is a flowchart of the driving device for discharging a load according to the first embodiment of the invention.

FIG. 5(b) is a flowchart of the driving device for discharging a load according to the first embodiment of the invention. Referring to FIG. 3, FIG. 4, and FIG. 5(b), the discharging process of the driving device 2 is introduced as follows. In Step S13, the first control signal C1 drives the voltage generator 21 to stop providing the reference voltage VREF for the output terminal 25 of the driving device 2 and charging the load 3 when the voltage of the first control signal C changes from logic "1" to logic "0". The second control signal C2 turns off the first NMOSFET 22 and the third control signal C3 turns off the first PMOSFET 23 to stop providing the supply voltage VDDIO for the output terminal 25 and charging the load 3 to the supply voltage VDDIO when the first control signal C1 drives the voltage generator 21 to stop providing the reference voltage VREF and charging the load 3. In Step S13, the voltages of the second control signal C2, the third control signal C3, and the node F are respectively logic "0", logic "1", logic "1". The first NMOSFET 22 and the first PMOSFET 23 are not simultaneously turned on lest the voltage level of the output terminal 25 be unstable.

After Step S13, Step S14 is performed. In Step S14, the second control signal C2 turns on the first NMOSFET 22 to discharge the load 3 to the low voltage through the output terminal 25 and the third control signal C3 turns off the first PMOSFET 23 to stop providing the supply voltage VDDIO and charging the load 3 to the supply voltage VDDIO when the first control signal C1 drives the voltage generator 21 to stop providing the reference voltage VREF and charging the load 3. That is to say, the voltage of the node F is logic "0". As a result, the voltage at the output terminal 25 is a digital voltage during the operation of the driving device 2.

Besides, Step S13 may be omitted in an ideal case. Provided that substantially the same result is achieved, the steps of the flowchart shown in FIG. 5(a) and FIG. 5(b) need not be in the exact order shown and need not be contiguous, that is, other steps can be intermediate.

In another embodiment of the invention, the driving device 2 may further include a signal buffer 26 coupled to the gates of the first NMOSFET 22 and the first PMOSFET 23. The signal buffer 26 receives the first control signal C1 and inverts and adjusts the waveform of the first control signal C1 to generate the third control signal C3 and the second control signal C2.

Figure 6:
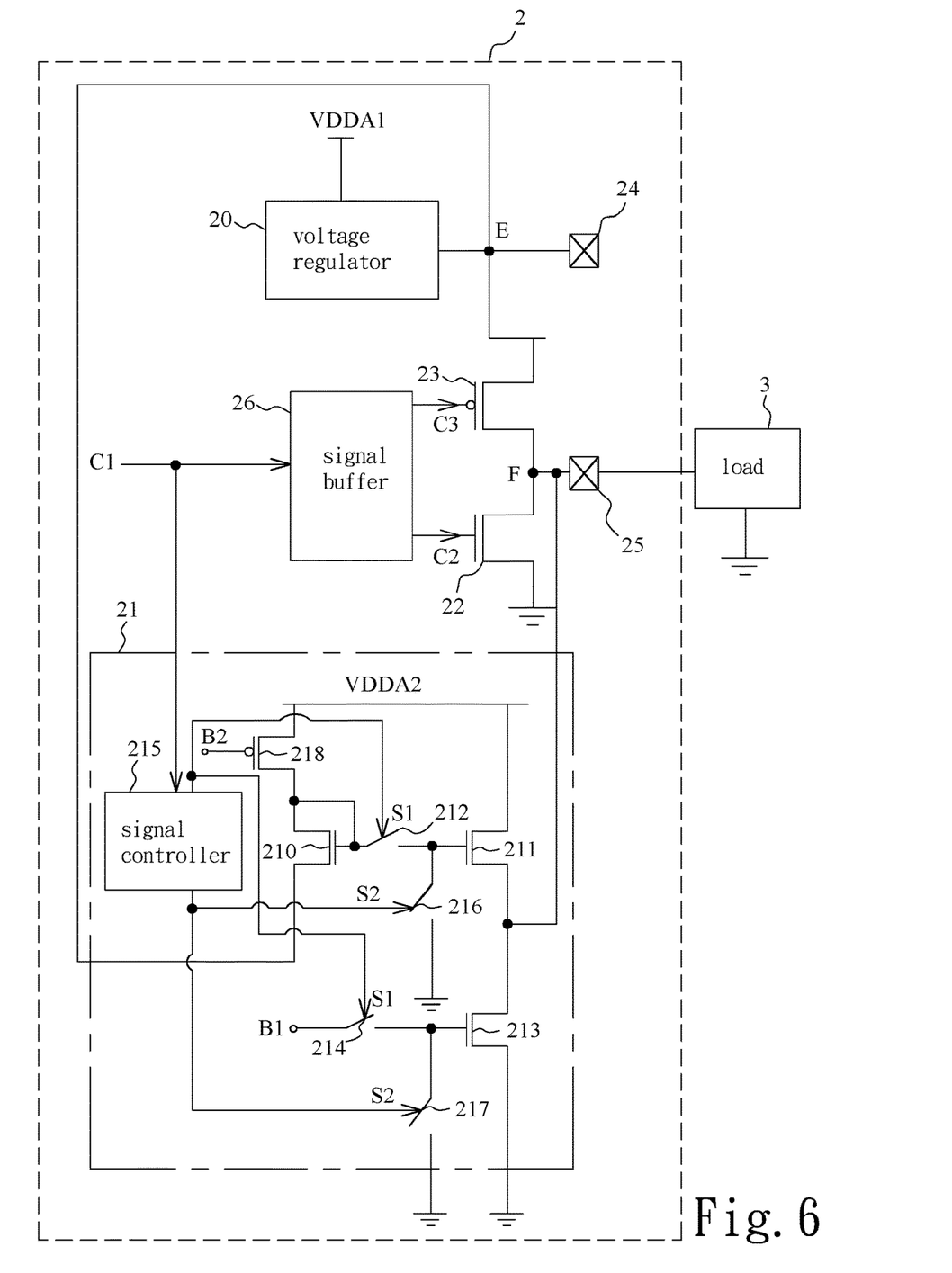
FIG. 6 is a diagram schematically illustrating a driving device according to a second embodiment of the invention.
Figure 7:
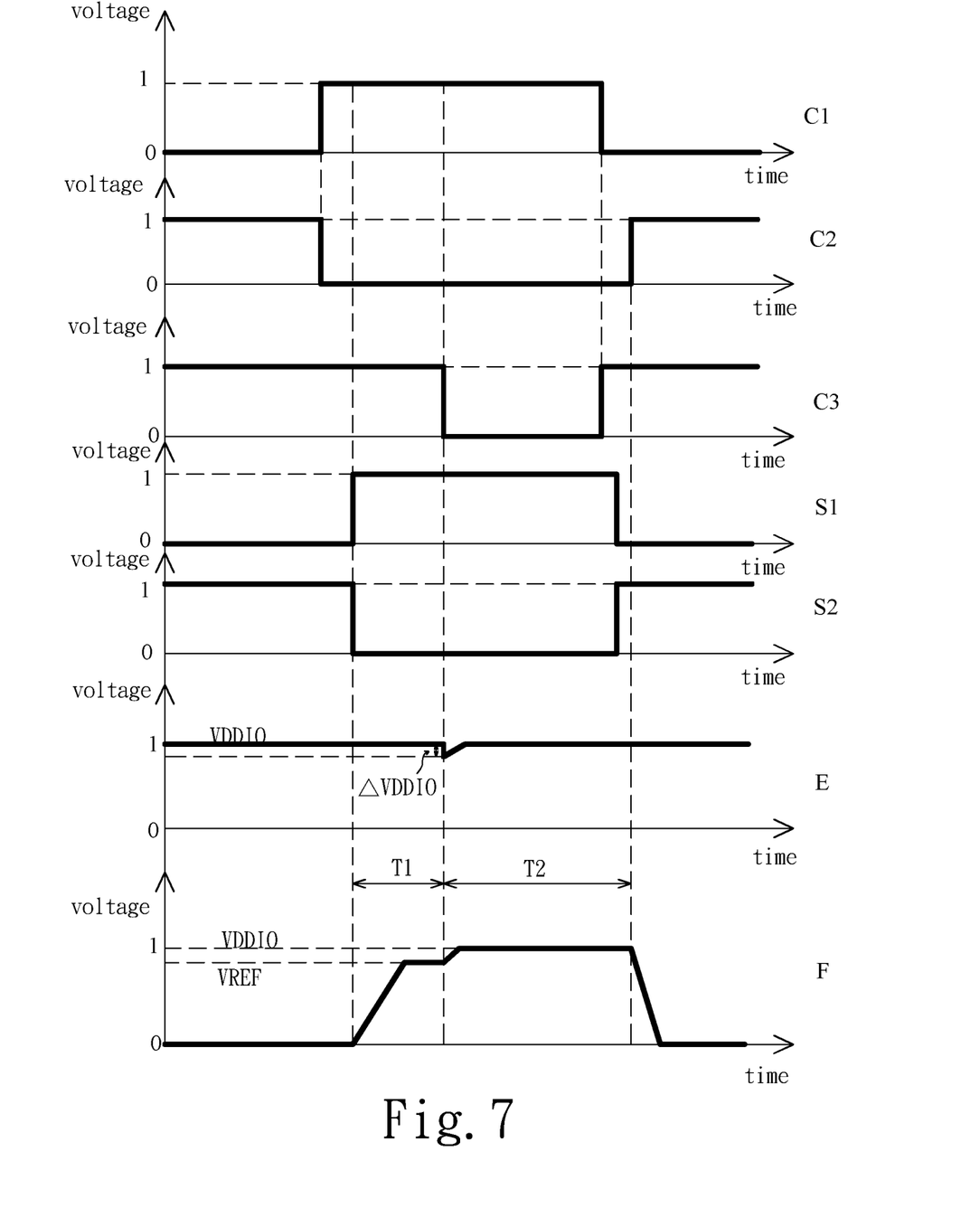
FIG. 7 is a diagram schematically illustrating the waveforms of nodes, a first control signal, a second control signal, and a third control signal of the driving device according to the second embodiment of the invention.

FIG. 6 is a diagram schematically illustrating a driving device according to a second embodiment of the invention. FIG. 7 is a diagram schematically illustrating the waveforms of nodes, a first control signal, a second control signal, and a third control signal of the driving device according to the second embodiment of the invention. Referring to FIG. 6 and FIG. 7, the second embodiment of the invention is introduced as follows. The second embodiment is different from the first embodiment in the voltage generator 21. In the second embodiment, the voltage generator 21 may include a second N-channel metal-oxide-semiconductor field effect transistor (NMOSFET) 210, a third N-channel metal-oxide-semiconductor field effect transistor (NMOSFET) 211, a first electronic switch 212, a fourth N-channel metal-oxide-semiconductor field effect transistor (NMOSFET) 213, a second electronic switch 214, a signal controller 215, a third electronic switch 216, and a fourth electronic switch 217. The third NMOSFET 211 is used as a source follower. The second NMOSFET 210 and the third NMOSFET 211 form a current mirror. The first electronic switch 212, the second electronic switch 214, the third electronic switch 216, and the fourth electronic switch 217 may be metal-oxide-semiconductor field effect transistors or bipolar junction transistors, but the invention is not limited thereto. The drain of the second NMOSFET 210 is coupled to the second high-voltage terminal. The gate of the second NMOSFET 210 is coupled to the drain of the second NMOSFET 210. The source of the second NMOSFET 210 is coupled to the voltage regulator 20. The drain of the third NMOSFET 211 is coupled to the second high-voltage terminal. The source of the third NMOSFET 211 is coupled to the output terminal 25. The first electronic switch 212 is coupled between the gate of the second NMOSFET 210 and the gate of the third NMOSFET 211. The drain of the fourth NMOSFET 213 is coupled to the output terminal 25 and the source of the third NMOSFET 211. The source of the fourth NMOSFET 213 is coupled to the low-voltage terminal. The second electronic switch 214 is coupled between the gate of the fourth NMOSFET 213 and a high bias terminal whose high bias is represented by B1. The signal controller 215 is coupled to the control terminals of the first electronic switch 212 and the second electronic switch 214. The third electronic switch 216 is coupled between the low-voltage terminal and the gate of the third NMOSFET 211. The control terminal of the third electronic switch 216 is coupled to the signal controller 215.

In the operation of the voltage generator 21, the second NMOSFET 210 receives the supply voltage VDDIO and the signal controller 215 receives the first control signal C1. The signal that the signal controller 215 controls the first electronic switch 212 and the second electronic switch 214 is represented by S1. The signal that the signal controller 215 controls the third electronic switch 216 and the fourth electronic switch 217 is represented by S2. When the voltage of the first control signal C1 changes from logic "0" to logic "1", the first control signal C1 drives the signal controller 215 to turn on the first electronic switch 212 and the second electronic switch 214 and to turn off the third electronic switch 216 and the fourth electronic switch 217. In other words, the voltages of the signals S1 and S2 are respectively logic "1" and logic "0" when the voltage of the first control signal C1 changes from logic "0" to logic "1". When the first control signal C1 drives the signal controller 215 to turn on the first electronic switch 212 and the second electronic switch 214, the second high voltage VDDA2 and the high bias B1 of the high bias terminal drive the second NMOSFET 210, the third NMOSFET 211, and the fourth NMOSFET 213 to provide the reference voltage VREF and charge the load 3 to the reference voltage VREF through the first electronic switch 212 and the second electronic switch 214. By adjusting the drain currents, the channel lengths and the channel widths of the second NMOSFET 210 and the third NMOSFET 211, the gate-source voltage of the second NMOSFET 210 is substantially lower than the gate-source voltage of the third NMOSFET 211, such that the output terminal 25 does not charge the conductive terminal 24. In practice, the gate-source voltage of the second NMOSFET 210 is near the gate-source voltage of the third NMOSFET 211.

When the first control signal C1 drives the signal controller 215 to turn off the first electronic switch 212 and the second electronic switch 214, the first control signal C1 drives the signal controller 215 to turn on the third electronic switch 216 and the fourth electronic switch 217 and the low voltage drives the third NMOSFET 211 and the fourth NMOSFET 213 to stop providing voltage and charging the load 3 through the third electronic switch 216 and the fourth electronic switch 217. In other words, the voltages of the signals S1 and S2 are respectively logic "0" and logic "1" when the first control signal C1 drives the signal controller 215 to turn off the first electronic switch 212 and the second electronic switch 214.

In some embodiment of the invention, the driving device 2 may further include a second P-channel metal-oxide-semiconductor field effect transistor (PMOSFET) 218 coupled between the second high-voltage terminal and the drain of the second NMOSFET 210. The gate of the second PMOSFET 218 receives a low bias B2 such that the second PMOSFET 218 is always turned on. Thus, the second NMOSFET 210 receives the second high voltage VDDA2 through the second PMOSFET 218.

Figure 8:
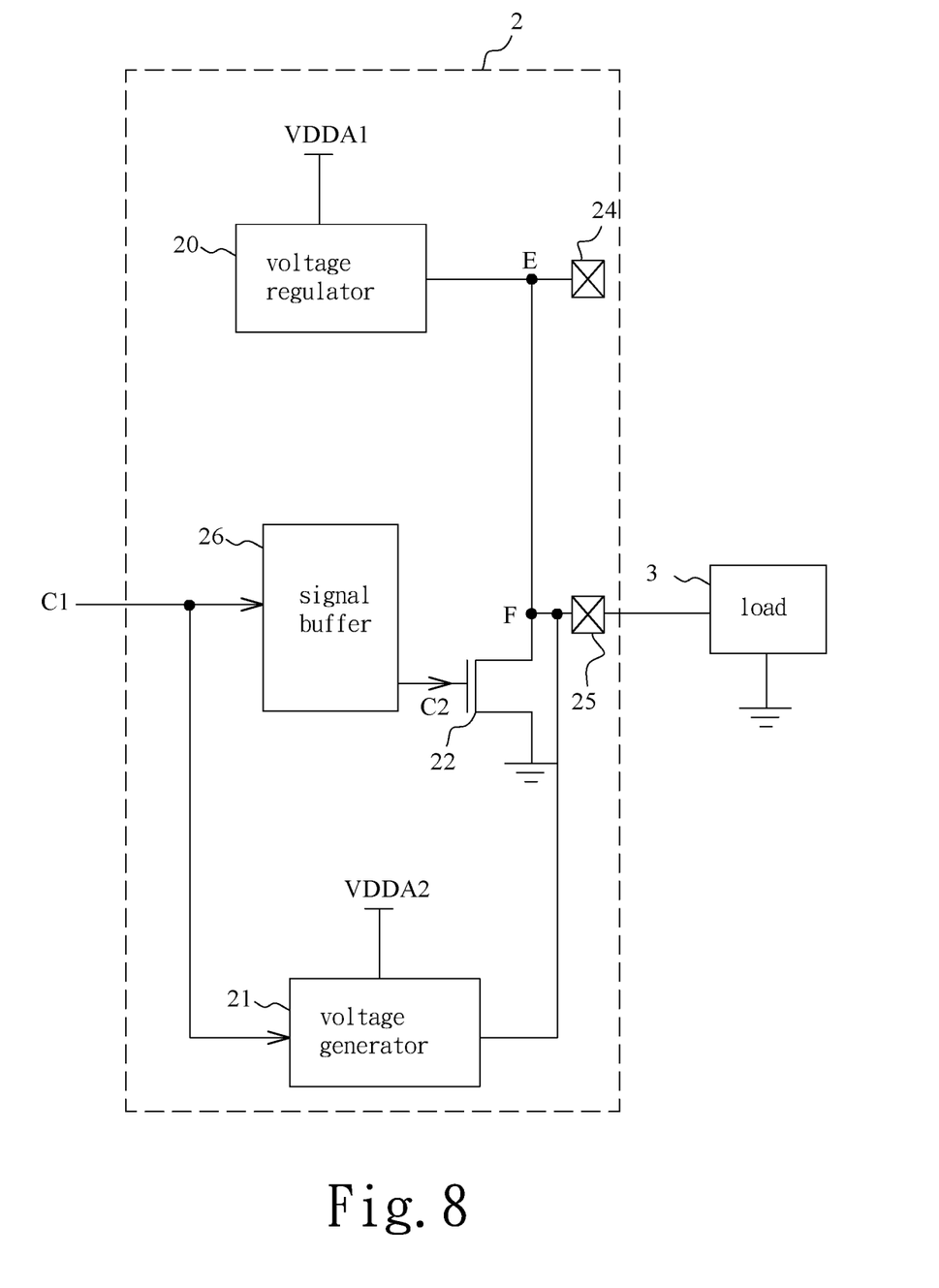
FIG. 8 is a diagram schematically illustrating a driving device according to a third embodiment of the invention.
Figure 9:
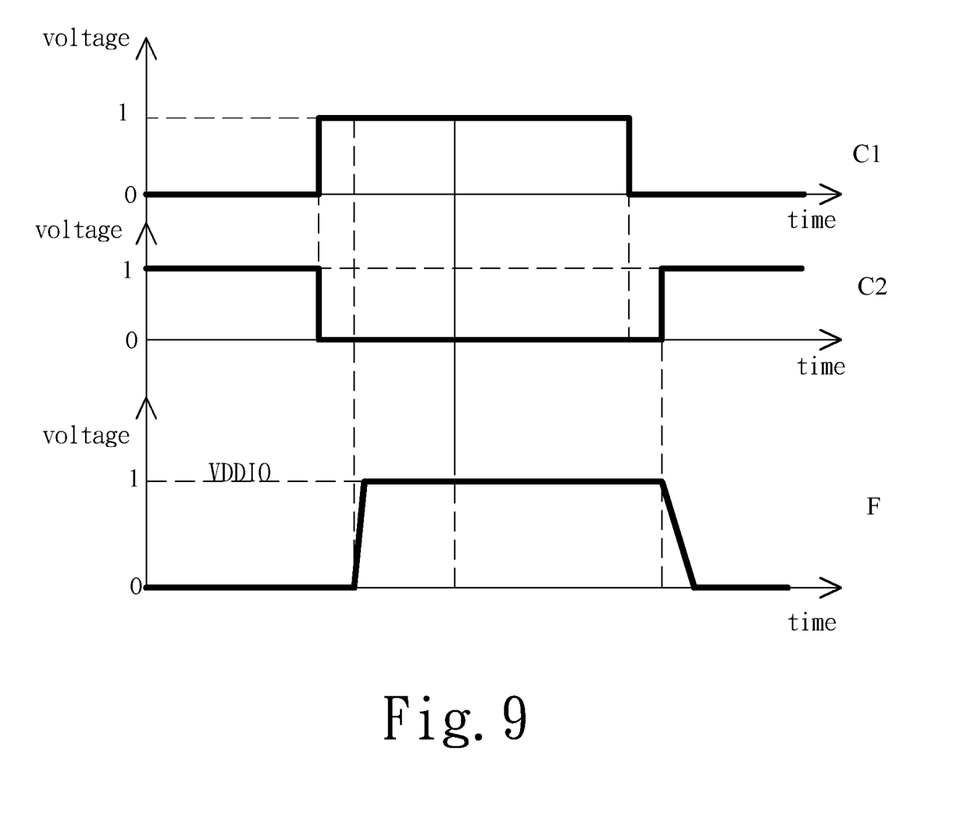
FIG. 9 is a diagram schematically illustrating the waveforms of nodes, a first control signal, and a second control signal of the driving device according to the third embodiment of the invention.

FIG. 8 is a diagram schematically illustrating a driving device according to a third embodiment of the invention. FIG. 9 is a diagram schematically illustrating the waveforms of nodes, a first control signal, and a second control signal of the driving device according to the third embodiment of the invention. Referring to FIG. 8 and FIG. 9, the third embodiment of the invention is introduced as follows. The third embodiment is different from the first embodiment in that the third embodiment omits the first PMOSFET and its operation. In the third embodiment, the output terminal 25 is directly coupled to the voltage regulator 20 and the conductive terminal 24. Thus, the voltage regulator 20 is coupled between the first high-voltage terminal and the output terminal 25 of the driving device 2. The voltage of the node E is equal to that of the node F.

The charging process of the driving device 2 is introduced as follows. The operations of the voltage regulator 20 and the signal buffer 26 of the third embodiment are the same as those of the first embodiment so will not be reiterated. Assume that the driving ability of the voltage generator 21 of the third embodiment is stronger than that of the first embodiment. The second control signal C2 turns off the first NMOSFET 22 when the first control signal C1 and the second high voltage VDDA2 of the second high-voltage terminal drive the voltage generator 21 to rapidly provide the supply voltage VDDIO for the output terminal 25 and charge the load 3 to the supply voltage VDDIO through the output terminal 25 within a specification period. Thus, the voltage of the node F is logic "1". The voltage generator 21 charges the load 3 to the supply voltage VDDIO within the specification period, thereby weakening or eliminating voltage undershoot of the conductive terminal 24. Accordingly, the driving device 2 is free of coupling to any external capacitor, thereby reducing the material cost of the IC and the space occupied by the entire module.

The discharging process of the driving device 2 is introduced as follows. The discharging process includes a first step and a second step sequentially performed. In the first step, the first control signal C1 drives the voltage generator 21 to stop providing voltage and charging the load 3 when the voltage of the first control signal C changes from logic "1" to logic "0". The second control signal C2 turns off the first NMOSFET 22 when the first control signal C1 drives the voltage generator 21 to stop charging the load 3. In the first step, the voltage of the second control signal C2 is logic "0" such that the voltage level of the output terminal 25 is stabler and the voltage of the node F is logic "1".

In the second step, the second control signal C2 turns on the first NMOSFET 22 to discharge the load 3 to the low voltage through the output terminal 25 when the first control signal C1 drives the voltage generator 21 to stop providing voltage and charging the load 3. Thus, the voltage of the node F is logic "0". As a result, the voltage at the output terminal 25 is a digital voltage during the operation of the driving device 2. Besides, the first step may be omitted in an ideal case.

Figure 10:
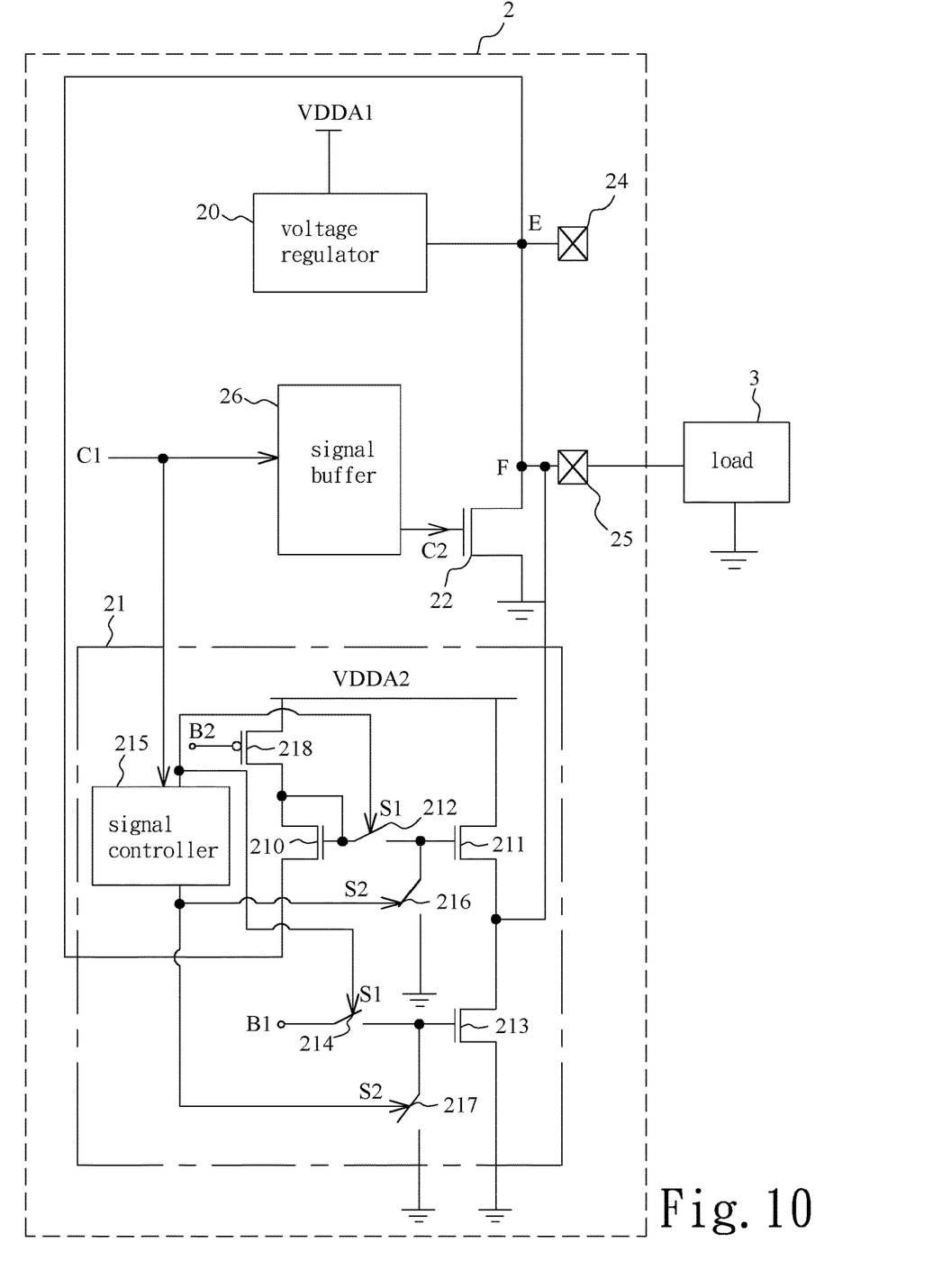
FIG. 10 is a diagram schematically illustrating a driving device according to a fourth embodiment of the invention.
Figure 11:
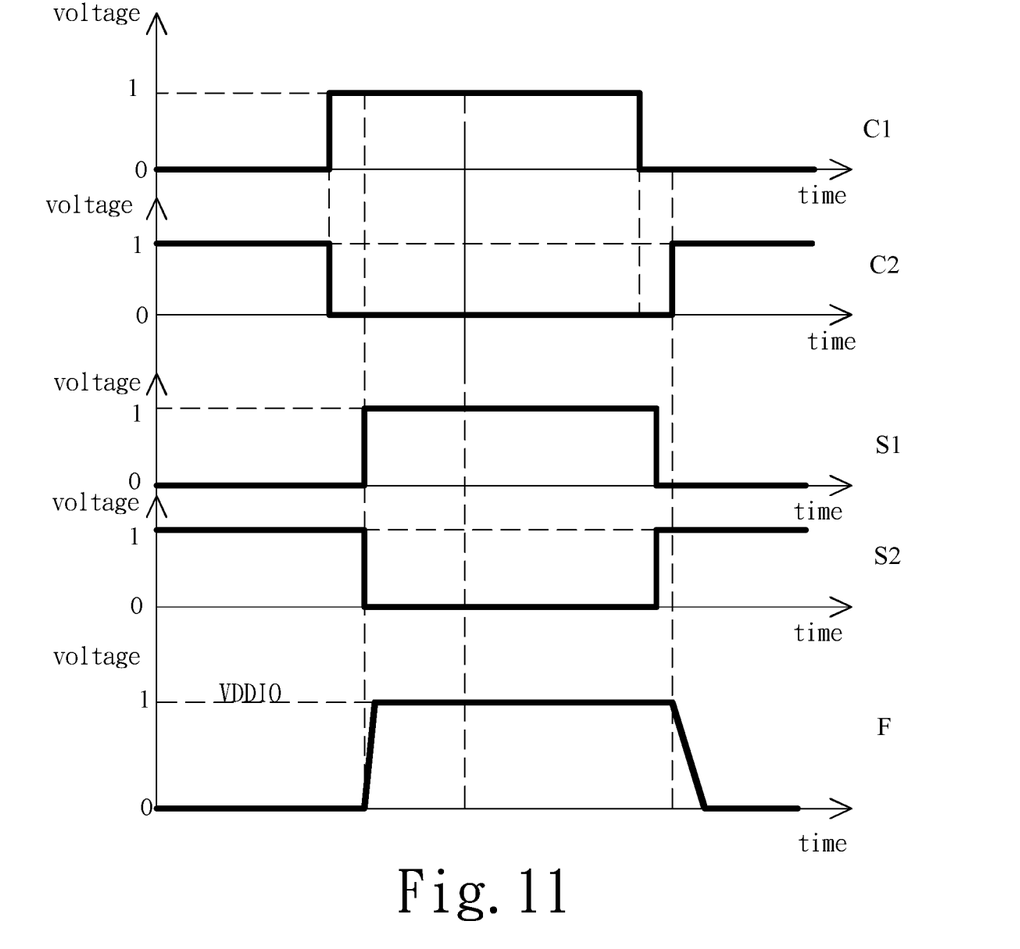
FIG. 11 is a diagram schematically illustrating the waveforms of nodes, a first control signal, and a second control signal of the driving device according to the fourth embodiment of the invention.

FIG. 10 is a diagram schematically illustrating a driving device according to a fourth embodiment of the invention. FIG. 11 is a diagram schematically illustrating the waveforms of nodes, a first control signal, and a second control signal of the driving device according to the fourth embodiment of the invention. Referring to FIG. 10 and FIG. 11, the fourth embodiment of the invention is introduced as follows. The fourth embodiment is different from the third embodiment in the voltage generator 21. The voltage generator 21 of the fourth embodiment is similar to that of the second embodiment. The voltage generator 21 of the fourth embodiment is slightly different from that of the second embodiment in the gate-source voltages of the second NMOSFET 210 and the third NMOSFET 211. In the fourth embodiment, the gate-source voltage of the second NMOSFET 210 is substantially equal to the gate-source voltage of the third NMOSFET 211 by adjusting the drain current, the channel lengths, and the channel widths of the second NMOSFET 210 and the third NMOSFET 211. The other features of the voltage generator 21 in FIG. 10 and FIG. 11 have been described previously so will not be reiterated.

According to the embodiments provided above, the driving device provides the reference voltage for the output terminal of the driving device to weaken voltage undershoot before the voltage regulator provides the supply voltage for the output terminal of the driving device. Thus, the driving device can avoid coupling to any external capacitor to reduce the material cost of the IC and the space occupied by the entire module.

The embodiments described above are only to exemplify the invention but not to limit the scope of the invention. Therefore, any equivalent modification or variation according to the shapes, structures, features, or spirit disclosed by the invention is to be also included within the scope of the invention.

What is claimed is:
1. A driving device, comprising:
a voltage regulator coupled between a first high-voltage terminal and an output terminal of the driving device and configured to receive a first high voltage of the first high-voltage terminal, wherein the voltage regulator is configured to step down the first high voltage to generate a supply voltage;
a voltage generator coupled to a second high-voltage terminal and the output terminal of the driving device and configured to provide a reference voltage for the output terminal of the driving device, wherein the reference voltage is substantially lower than the supply voltage; and
a first N-channel metal-oxide-semiconductor field effect transistor (NMOSFET) coupled between the output terminal of the driving device and a low-voltage terminal;
wherein the voltage generator includes:
a second N-channel metal-oxide-semiconductor field effect transistor (NMOSFET) coupled to the second high-voltage terminal and the voltage regulator;
a third N-channel metal-oxide-semiconductor field effect transistor (NMOSFET) coupled to the second high-voltage terminal and the output terminal of the driving device;
a first electronic switch coupled between the second NMOSFET and the third NMOSFET;
a fourth N-channel metal-oxide-semiconductor field effect transistor (NMOSFET) coupled to the output terminal of the driving device, the third NMOSFET, and the low-voltage terminal;
a second electronic switch coupled between the fourth NMOSFET and a high bias terminal; and
a signal controller coupled to control terminals of the first electronic switch and the second electronic switch.
2. The driving device according to claim 1, further comprising a signal buffer coupled to the first NMOSFET.
3. The driving device according to claim 1, wherein the voltage generator further includes:
a third electronic switch coupled between the low-voltage terminal and the third NMOSFET, and a control terminal of the third electronic switch is coupled to the signal controller; and
a fourth electronic switch coupled between the low-voltage terminal and the fourth NMOSFET, a control terminal of the fourth electronic switch is coupled to the signal controller.
4. The driving device according to claim 1, further comprising a turned-on P-channel metal-oxide-semiconductor field effect transistor (PMOSFET) coupled between the second high-voltage terminal and the second NMOSFET.
5. The driving device according to claim 1, further comprising a P-channel metal-oxide-semiconductor field effect transistor (PMOSFET) coupled between the voltage regulator and the output terminal of the driving device.
6. The driving device according to claim 1, wherein the output terminal of the driving device is a digital output terminal and a voltage at the output terminal of the driving device is a digital voltage.

7. The driving device according to claim 1, wherein the first high voltage of the first high-voltage terminal is substantially equal to a second high voltage of the second high-voltage terminal.

* * * * *